United States Patent
Nishihara

(10) Patent No.: US 7,928,516 B2
(45) Date of Patent: Apr. 19, 2011

(54) SEMICONDUCTOR STORAGE DEVICE AND MANUFACTURING METHOD THEREOF

(75) Inventor: Kiyohito Nishihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 12/276,815

(22) Filed: Nov. 24, 2008

(65) Prior Publication Data

US 2009/0140312 A1 Jun. 4, 2009

(30) Foreign Application Priority Data

Nov. 30, 2007 (JP) ................................ 2007-311418

(51) Int. Cl.
  *H01L 29/76* (2006.01)
(52) U.S. Cl. ................. 257/390; 257/314; 257/E27.102
(58) Field of Classification Search .................. 257/390, 257/314, E27.102
  See application file for complete search history.

(56) References Cited

U.S. PATENT DOCUMENTS

| 6,461,916 B1* | 10/2002 | Adachi et al. ................. 438/257 |
| 7,547,943 B2* | 6/2009 | Cho et al. ....................... 257/326 |
| 7,745,884 B2* | 6/2010 | Sato et al. ...................... 257/390 |
| 7,795,643 B2* | 9/2010 | Sel et al. ........................ 257/202 |
| 2006/0023558 A1 | 2/2006 | Cho et al. |
| 2006/0035437 A1* | 2/2006 | Mitsuhira et al. ............. 438/424 |
| 2007/0102749 A1 | 5/2007 | Shirota et al. |

FOREIGN PATENT DOCUMENTS

| JP | 4-79370 | 3/1992 |
| JP | 2007-110029 | 4/2007 |

* cited by examiner

*Primary Examiner* — Eugene Lee
(74) *Attorney, Agent, or Firm* — Oblon, Spivak, McClelland, Maier & Neustadt, L.L.P.

(57) ABSTRACT

A semiconductor storage device include a semiconductor substrate, an insulating layer provided on the semiconductor substrate and having an opening, a semiconductor layer provided on the insulating layer, the semiconductor layer having a recess at a center of a surface thereof above the opening, a memory cell unit provided on the semiconductor layer and including a plurality of memory cells, current paths of the memory cells being connected in series, a selecting transistor adjacent to the memory cell unit and arranged on a region of the semiconductor layer including the recess, the selecting transistor including a gate insulating film provided on the region of the semiconductor layer including the recess and a gate electrode provided on the gate insulating film.

10 Claims, 19 Drawing Sheets

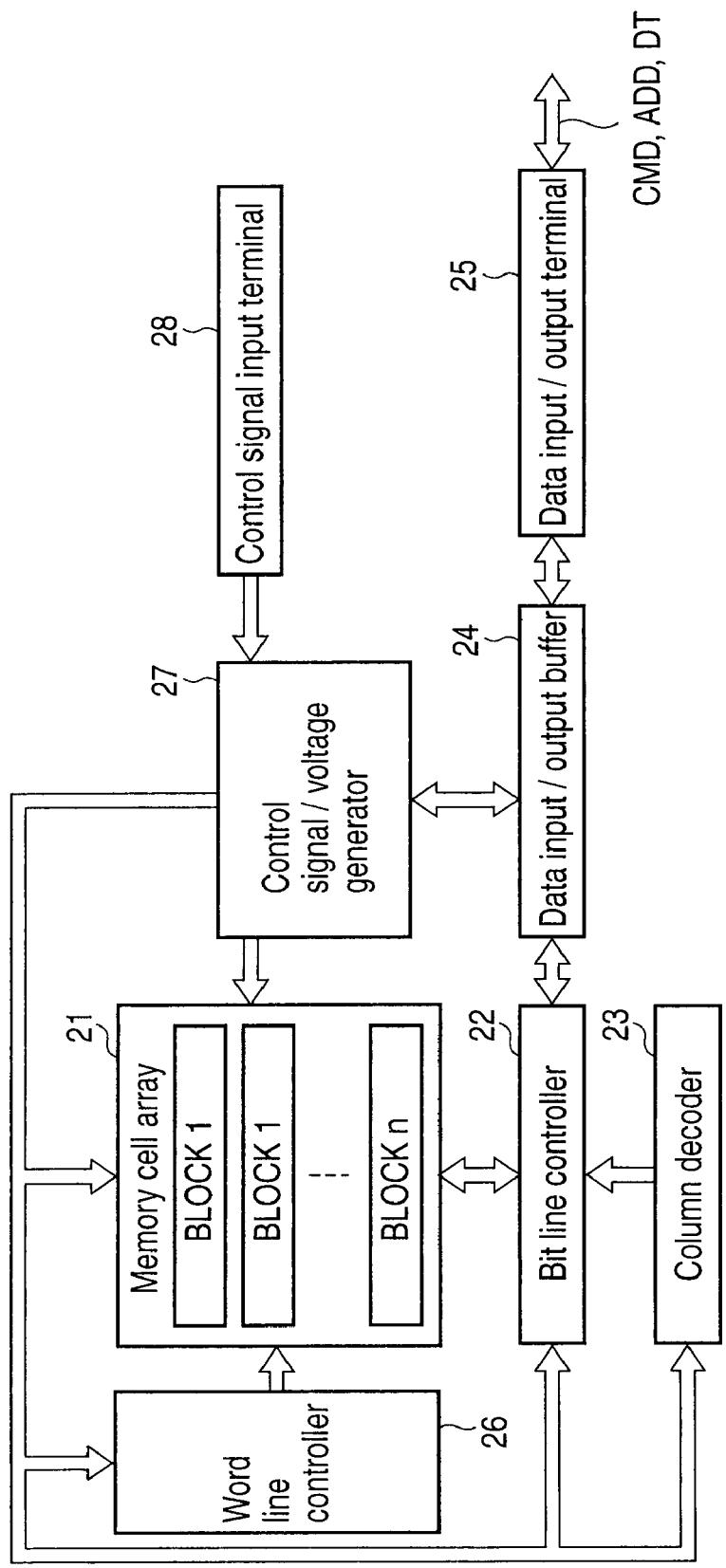
F I G. 2

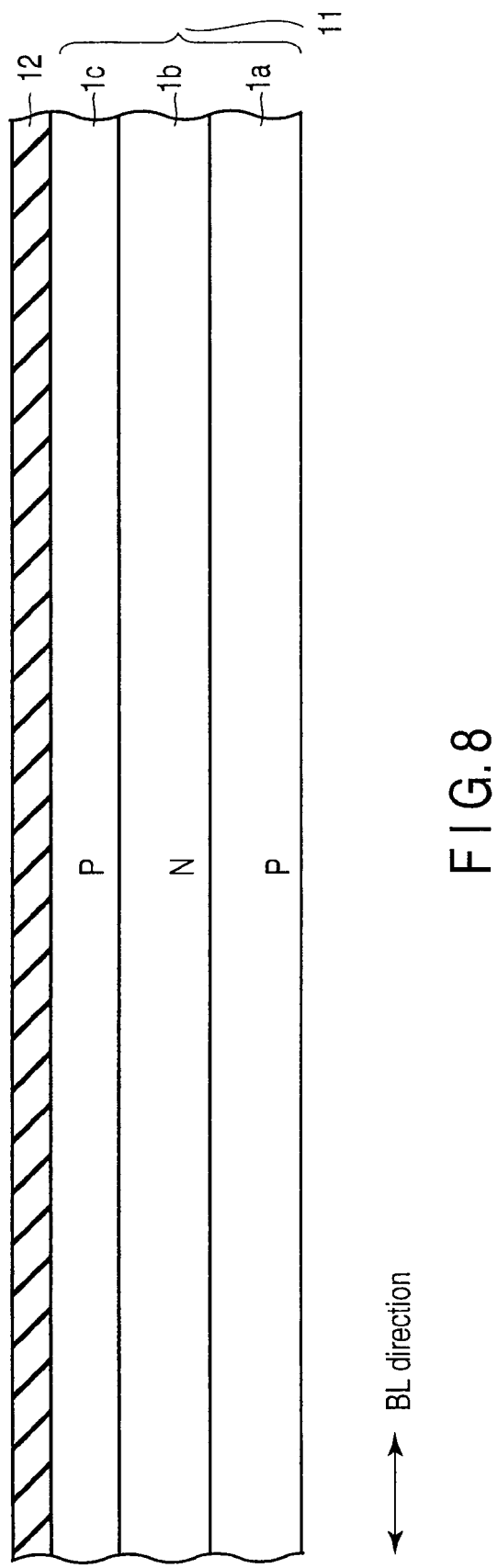
F I G. 8

$$X = \sqrt{da\text{-}Si^2 - Lop^2(Lop/2)^2}$$

Step $\Delta$ = da-Si - x

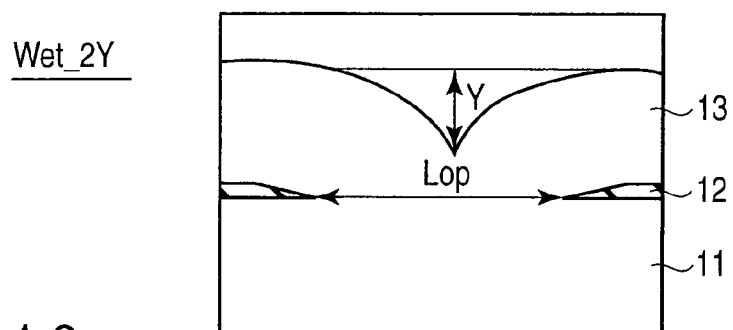
FIG. 19
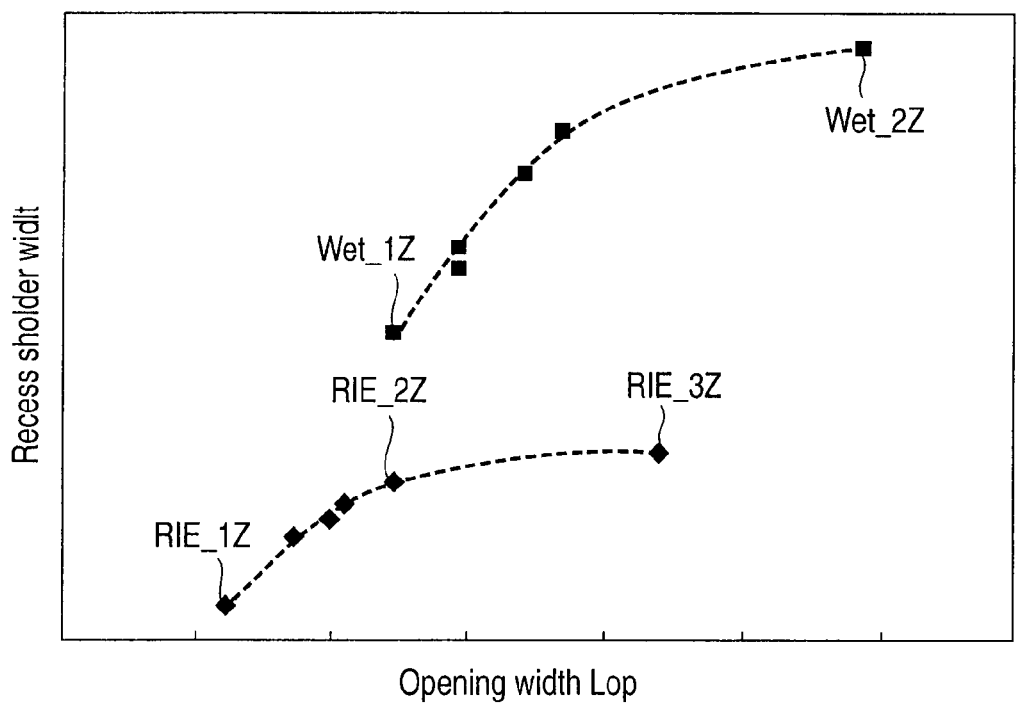
FIG. 20  (◆ By RIE / ■ By wet etching)

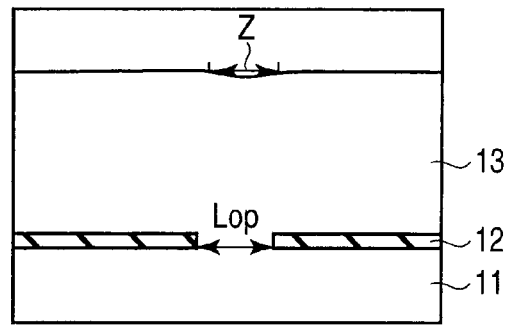
F I G. 2 1
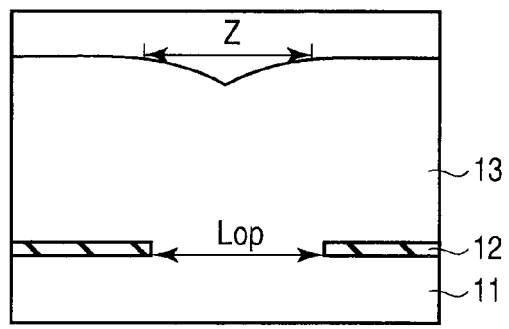
F I G. 2 2
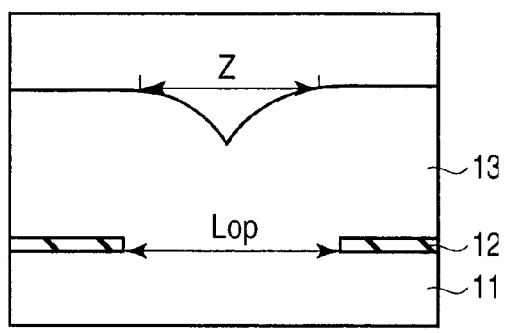
F I G. 2 3

SEMICONDUCTOR STORAGE DEVICE AND MANUFACTURING METHOD THEREOF

CROSS-REFERENCE TO RELATED APPLICATIONS

This application is based upon and claims the benefit of priority from prior Japanese Patent Application No. 2007-311418, filed Nov. 30, 2007, the entire contents of which are incorporated herein by reference.

BACKGROUND OF THE INVENTION

1. Field of the Invention

The present invention relates to a semiconductor storage device and a manufacturing method thereof which are applied to, e.g., a NAND flash EEPROM constituted of a partial SOI memory cell array.

2. Description of the Related Art

In a semiconductor storage device, e.g., a NAND flash memory, a problem is miniaturization of a memory cell because of a demand for an increase in capacity and a reduction in bit unit price.

However, miniaturization of a device isolation region involved by miniaturization of a memory cell causes a reduction in breakdown voltage between cells. Therefore, in order to realize miniaturization of a cell without reducing the breakdown voltage, a technology of forming a memory cell array on a silicon-on-insulator (SOI) substrate is effective. For example, JP-A 2007-110029 (KOKAI) discloses a semiconductor storage device and a manufacturing method thereof that form a NAND cell unit on a partial SOI substrate.

Here, besides miniaturization of the memory cell, further miniaturization of a selecting transistor is another problem. However, in miniaturization of the selecting transistor, especially in shrinkage in a gate length direction, it is impossible to avoid degradation in transistor characteristics such as 1) degradation in cutoff characteristics and 2) an increase in fluctuation amount of a threshold voltage (Vth) caused due to a variation of a channel length dimension by a short channel effect. Therefore, degradation in performance, e.g., a decrease in operating speed of the selecting transistor is provoked.

Therefore, in order to miniaturize the NAND flash memory, it is necessary to shrink the selecting transistor in a gate length direction while maintaining and improving characteristics of not only each memory cell but also the selecting transistor.

Therefore, realization of a semiconductor storage device and a manufacturing method thereof that can improve characteristics of the selecting transistor when a memory cell unit and the selecting transistor are formed on a semiconductor layer configured on an SOI has been demanded.

BRIEF SUMMARY OF THE INVENTION

According to a first aspect of the invention, there is provided a semiconductor storage device, which include:
a semiconductor substrate;
an insulating layer provided on the semiconductor substrate and having an opening;
a semiconductor layer provided on the insulating layer, the semiconductor layer having a recess at a center of a surface thereof above the opening;
a memory cell unit provided on the semiconductor layer and including a plurality of memory cells, current paths of the memory cells being connected in series;
a selecting transistor adjacent to the memory cell unit and arranged on a region of the semiconductor layer including the recess, the selecting transistor including a gate insulating film provided on the region of the semiconductor layer including the recess and a gate electrode provided on the gate insulating film.

According to a second aspect of the invention, there is provided a manufacturing method for a semiconductor storage device, which includes:
forming an insulating layer on a semiconductor substrate;
forming an opening from which a surface of the semiconductor substrate is exposed at a predetermined position in the insulating layer;
forming a semiconductor layer of a first conductivity type on the semiconductor substrate exposed from the opening and the insulating layer, to form a recess in a region of the semiconductor layer above the opening in a self-aligning manner;
annealing the semiconductor layer to crystallize the semiconductor layer after said forming the recess in the self-aligning manner; and
etching the semiconductor layer to reduce a film thickness of the semiconductor layer;
forming a tunnel insulating film and a gate electrode on the semiconductor layer; and
etching the gate electrode to form a plurality of memory cell units on the semiconductor layer.

BRIEF DESCRIPTION OF THE SEVERAL VIEWS OF THE DRAWING

FIG. 2 is a block diagram showing an entire structure of the NAND flash memory;

FIGS. 8 to 12 are cross-sectional views showing a manufacturing process of the semiconductor storage device according to the first embodiment in stages;

FIG. 19 is a view showing a cross-sectional structure at one observation point (Wet_2Y) in FIG. 15;

FIG. 20 is a view showing a relationship between a shoulder width and an opening width in the recess structure;

FIG. 21 is a view showing a cross-sectional structure at one observation point (RIE_1Z) in FIG. 20;

FIG. 22 is a view showing a cross-sectional structure at one observation point (RIE_2Z) in FIG. 20;

FIG. 23 is a view showing a cross-sectional structure at one observation point (RIE_3Z) in FIG. 20;

DETAILED DESCRIPTION OF THE INVENTION

Prior to an explanation of an embodiment, an outline of the present invention will be described. Although a NAND flash memory with a two-layer gate structure having a floating gate electrode and a control gate electrode will be taken as an example and explained in the embodiment, the present invention can be also applied to, e.g., a metal-oxide-nitride-oxide-silicon (MONOS) nonvolatile semiconductor storage device using a silicon nitride film (an $Si_3N_4$ film) as a charge storage layer in place of a floating gate electrode or a tantalum-nitride-aluminum oxide-nitride-oxide-silicon (TANOS) nonvolatile semiconductor storage device using a control gate electrode of a tantalum nitride film and a high-dielectric-constant insulating film, e.g., an alumina ($Al_2O_3$) film.

Figure 1:
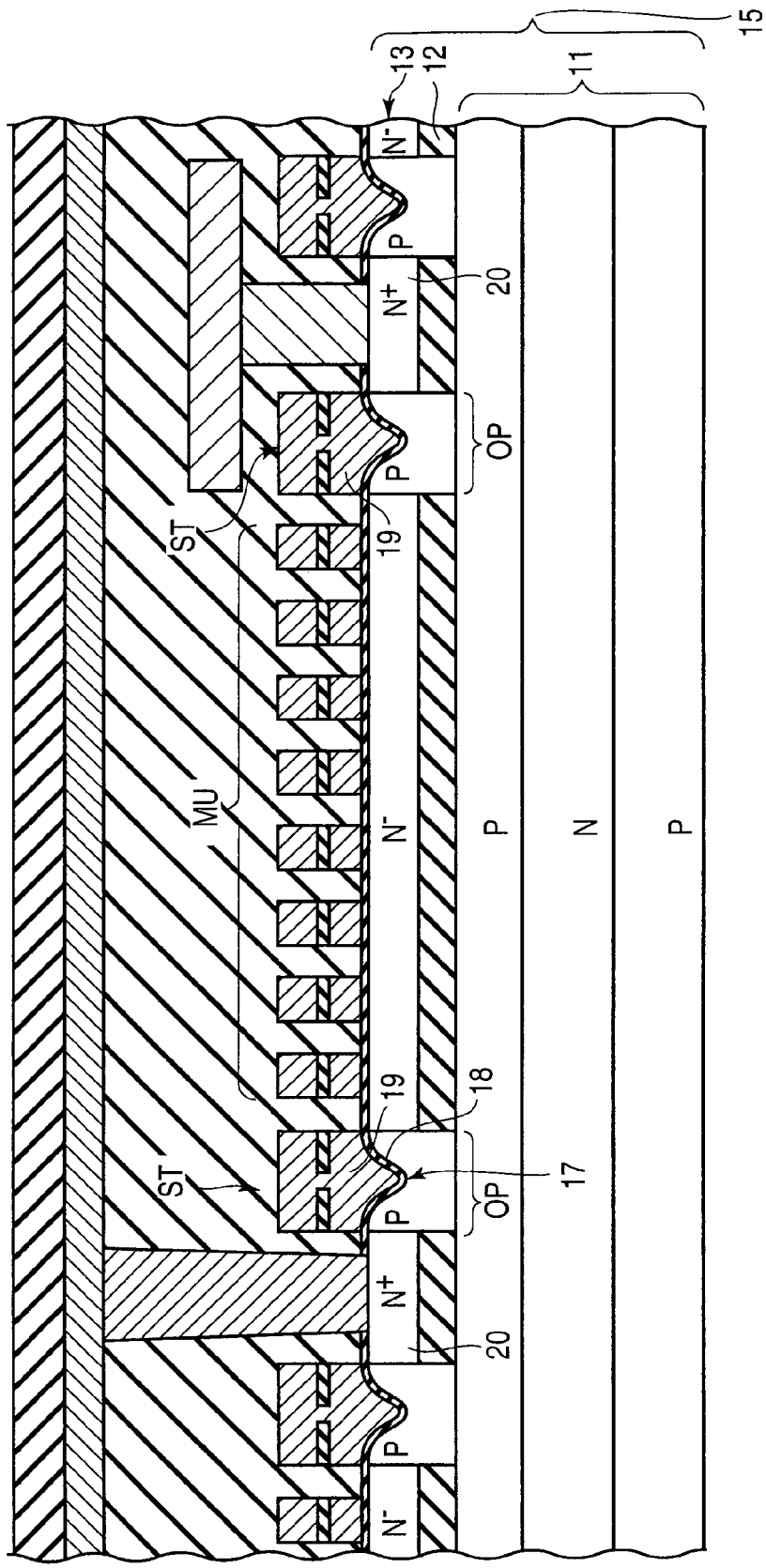
FIG. 1 is a cross-sectional view of a NAND flash memory according to a first embodiment.

For example, as shown in FIG. 1, a semiconductor storage device according to the embodiment includes: a support substrate 15 that includes a semiconductor substrate 1, an insulating layer 12 that is provided on the semiconductor substrate and has an opening OP, and a semiconductor layer 13 provided on the insulating layer; a memory cell unit MU that is provided on the semiconductor layer and includes a plurality of memory cells connected with a current path in series; and a selecting transistor ST that is adjacent to the memory cell unit, arranged on the semiconductor layer above the opening, has a recess structure 17 where only a substantially central part of an upper surface of the semiconductor layer above the opening is lower than the semiconductor layer having the memory cell unit provided thereon, and includes a gate insulating film 18 provided on the semiconductor layer in the recess structure and a gate electrode 19 provided on the gate insulating film.

According to this structure, the selecting transistor ST includes the recess structure 17 in which only the substantially central part is lower than the semiconductor layer having the memory cell unit MU provided thereon and which is placed above an opening OP.

Therefore, an effective channel length of the selecting transistor ST can be increased, and cutoff characteristics of the selecting transistor ST can be improved. Further, since the channel length can be increased, an increase in fluctuation amount of a threshold voltage (Vth) can be avoided.

Furthermore, since the memory cell unit MU is provided on a partial SOI substrate (the support substrate) 15, the breakdown voltage between memory cells can be improved.

In this manner, according to the above-explained structure, when the memory cell unit MU and the selecting transistor are formed on the partial SOI substrate, characteristics of the selecting transistor can be improved.

An embodiment according to the present invention will now be explained hereinafter in detail. In the following embodiment, a NAND flash memory will be taken as an example and explained. It is to be noted that like reference numbers denote like parts throughout the drawings.

First Embodiment

<Structure of Semiconductor Device>

Although FIG. 1 shows a cross-sectional view of a semiconductor storage device according to a first embodiment, an entire structure of a NAND flash memory system using this semiconductor storage device will be first explained with reference to FIG. 2.

The NAND flash memory according to this embodiment is constituted of a memory cell array 21, a bit line controller 22, a column decoder 23, a data input/output buffer 24, a data input/output terminal 25, a word line controller 26, a control signal/voltage generator 27, and a control signal input terminal 28.

The memory cell array 21 is formed of a plurality of blocks (a BLOCK 1, a BLOCK 2, ..., a BLOCK n). The word line controller 26 that controls word lines and the bit line controller 22 that controls bit lines are connected with this memory cell array 21.

The bit line controller 22 reads data in memory cells in the memory cell array 21 via the bit lines to detect states of the memory cells in the memory cell array 21. Moreover, the bit line controller 22 applies a write control voltage to the memory cells in the memory cell array 11 via the bit lines to write information in the memory cells. To the bit line controller 22 are connected the column decoder 23, the data input/output buffer 24, and the control signal/voltage generator 27.

A data storage circuit (not shown) is provided in the bit line controller 22, and this data storage circuit is selected by the column decoder 23. Data in a memory cell read to the data storage circuit is output to the outside from the data input/output terminal 25 through the data input/output buffer 24. The data input/output terminal 25 is connected with, e.g., a host device provided outside the NAND flash memory.

The host device is, e.g., a microcomputer and receives data output from the data input/output terminal 25. Additionally, the host device outputs various commands CMD that control operations of the NAND flash memory, an address ADD, and data DT. Write data input to the data input/output terminal 25 from the host device is supplied to the data storage circuit (not shown) selected by the column decoder 23 through the data input/output buffer 24. On the other hand, the commands and the addresses are supplied to the control signal/voltage generator 27.

The word line controller 26 selects a word line in the memory cell array 21, and applies a voltage required for reading, writing, or erasing to the selected word line.

The control signal/voltage generator 27 is connected with the memory cell array 21, the bit line controller 22, the column decoder 23, the data input/output buffer 24, and the word line controller 26. The connected constituent circuits are controlled by the control signal/voltage generator 27. The control signal/voltage generator 27 is connected with the control signal input terminal 28 and controlled by a control signal, e.g., an address latch enable (ALE) signal input from the host device through the control signal input terminal 28.

Here, the word line controller 26, the bit line controller 22, the column decoder 23, and the control signal/voltage generator 27 constitute a write circuit and a read circuit.

A structural example of a block BLOCK according to the first embodiment will now be explained with reference to FIG. 3. Here, one block BLOCK 1 will be taken as an example and explained.

Here, an erasing operation in the NAND flash memory is collectively executed in units of this block BLOCK. Therefore, the block BLOCK is an erasing unit.

The block BLOCK 1 includes a plurality of memory cell units MU arranged in a WL direction and selecting transistors ST1 and ST2 that select a memory cell unit.

The memory cell unit MU is constituted of eight memory cell transistors MT connected with a current path in series. One end of the current path of the selecting transistor ST1 is connected with one end of the current path of the memory cell unit MU. One end of a current path of the selecting transistor ST2 is connected with the other end of the current path of the memory cell unit MU. Although the memory cell unit MU is constituted of the eight memory cells MT in this embodiment, it can be constituted of two or more memory cells, and the number of the memory cells is not restricted to eight in particular.

A reading operation and a writing operation in the NAND flash memory are collectively executed in units of PAGE depicted in the drawing. Therefore, PAGE is a reading and writing unit.

The other end of the current path of the selecting transistor ST1 is connected with a source line SL. The other end of the current path of the selecting transistor ST2 is connected with a bit line BL.

The word lines WL are extended in the WL direction and connected with a control electrode of the plurality of memory cell transistors MT in common. A selecting gate line SGS is extended in the WL direction, and connected with gate electrodes of the plurality of selecting transistors ST1 in the WL direction in common. A selecting gate line SGD is also extended in the WL direction, and connected with gate electrodes of the plurality of selecting transistors ST2 in the WL direction in common.

Plane structures and cross-sectional structures of the memory cell unit MU and the selecting transistors ST1 and ST2 according to the first embodiment will now be explained with reference to FIGS. 4 to 6.

Figure 4:
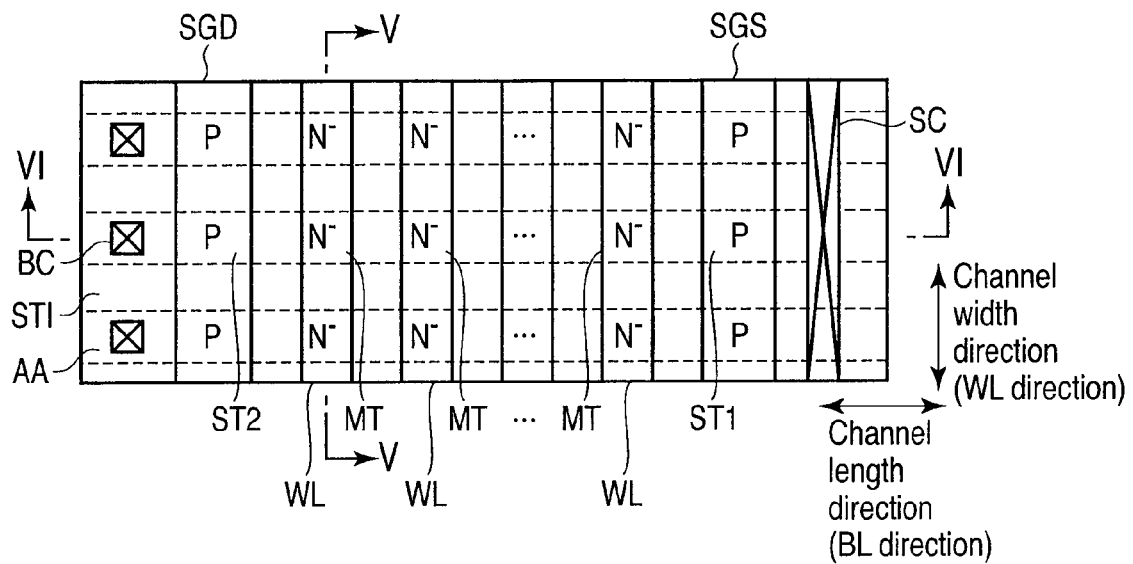
FIG. 4 is a schematic plan view of a semiconductor storage device according to the first embodiment.

As shown in FIG. 4, each device region AA and each device isolation insulating film STI are extended in a BL direction. The device region AA and the device isolation insulating film STI are alternately arranged in the WL direction. The plurality of word lines WL are extended in the WL direction at predetermined intervals in the BL direction. The selecting gate lines SGD and SGS extended in the WL direction are arranged to sandwich these word lines therebetween.

Further, the memory cell transistor MT is formed at each intersection of the device region AA and the word line WL, and the selecting transistors ST1 and ST2 are formed at intersections of the device region AA and the selecting gate lines SGD and SGS. A bit line contact BC is formed in each device region AA provided outside the selecting gate line SGD. A source line contact SC extended in the WL direction is formed outside the selecting gate line SGS. Furthermore, a bit line (not shown) that is connected with the bit line contact BC and extended in the BL direction is arranged on each device region AA.

Figure 6:
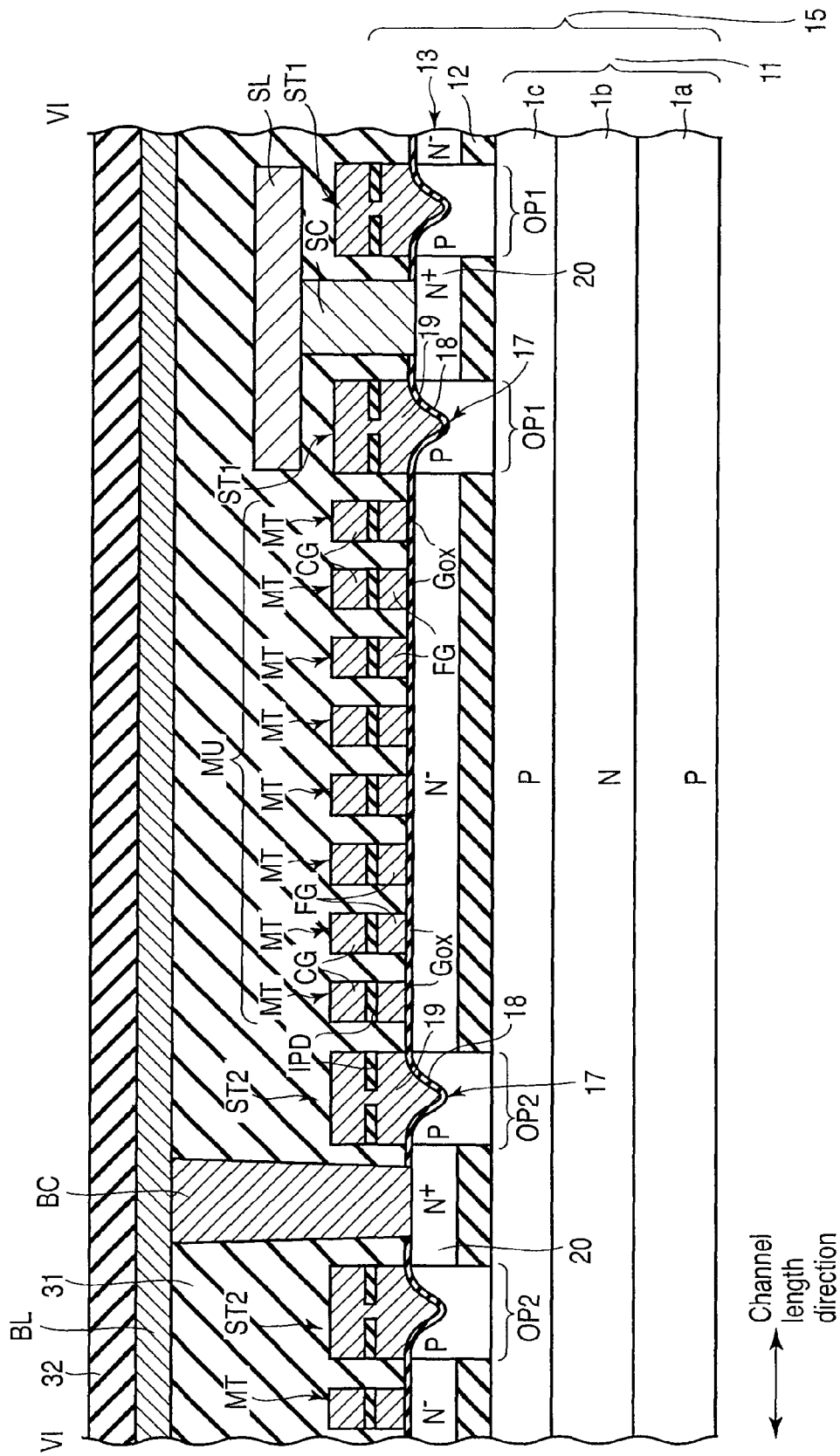
FIG. 6 is a cross-sectional view taken along a line VI-VI in FIG. 4.

As shown in FIG. 6, the memory cell unit MU and the selecting transistors ST1 and ST2 each having the recess structure 17 are provided on the support substrate 15.

The support substrate 15 includes the semiconductor substrate 11 provided with a P well 1$a$, an N well 1$b$, and a P well 1$c$ sequentially formed in the substrate, a buried oxide (BOX) layer (the insulating layer) 12 which is provided on the semiconductor substrate 11 and has openings OP1 and OP2 at predetermined positions, and the semiconductor layer 13 provided on the BOX layer 12.

As shown in the drawing, the support substrate 15 is an SOI substrate that has the semiconductor (Si) layer 13 formed above the semiconductor (Si) substrate 11 to be separated by the BOX layer 12. Here, the semiconductor layer 13 is not completely electrically separated from the semiconductor substrate 11, and is electrically connected with the semiconductor substrate 11 through the openings OP1 and OP2 formed in the BOX layer 12. In this sense, the support substrate (the SOI substrate) 15 in this embodiment will be referred to as a "partial SOI substrate" hereinafter.

In the semiconductor layer 13, an N$^-$ well is formed below the memory cell unit MU, a P well is formed below the selecting transistor ST1 or ST2, and an N$^+$ well is formed below the bit line contact BC and the source line contact SC, respectively.

The memory cell unit MU is provided on the semiconductor layer 13 and includes the plurality of (eight in this example) memory cell transistors MT, the current paths of which are connected in series.

The memory cell transistor MT has a stacked structure including a tunnel insulating film Gox, a floating electrode FG, an inter-gate insulating film IPD, and a control electrode CG which are sequentially provided on the semiconductor layer (the N$^-$ layer) 13. That is, this memory cell is formed as an N-type channel transistor in which the silicon layer 13 is used as a channel body and a source/drain and a charge storage layer and a control gate are formed on the channel body. It is to be noted that a diffusion layer (a source/drain) formed of an N$^+$ layer may be provided on the semiconductor layer 13 between the memory cell transistors MT in order to reduce the resistance of the semiconductor layer 13 having the memory cell unit MU formed thereon.

The semiconductor layer having the selecting transistor ST1 or ST2 provided thereon has the recess structure 17 in which only a substantially central part is lower than the semiconductor layer (N$^-$ layer) 13 having the memory cell unit MU provided thereon and which is placed above the opening OP1 or OP2 of the BOX layer 12. The selecting transistor ST1 or ST2 includes a gate insulating film 18 provided on the semiconductor layer 13 having the recess structure 17 formed therein and a gate electrode provided on the gate insulating film 18. The selecting transistor ST1 or ST2 is arranged to be adjacent to the memory cell unit MU along the BL direction in order to select the memory cell unit MU. The selecting transistor is an n-type channel transistor in which its channel body region is formed of a P-type diffusion layer.

Additionally, the gate electrode 19 is formed of an upper gate electrode and a lower gate electrode, and the inter-gate insulating film IPD having an opening at a part corresponding to a part near the center of the recess structure 17 is formed in the gate electrode 19. The upper gate electrode has the same material as that of the control electrode CG of the memory cell transistor MT, the lower gate electrode has the same material as that of the floating electrode FG of the memory cell transistor MT, and the inter-gate insulating film has the same material as that of the inter-gate insulating film IPD of the memory cell transistor MT.

Further, an upper surface of the gate electrode of the selecting transistor ST1 or ST2 may be formed substantially flat instead of the recess structure. Here, "substantially flat" means the upper surface of the under part layer of the gate electrode is flat and the upper surface of the upper part layer of the gate electrode is flat irrespective of the recess structure. More specifically, the upper surface of the upper part layer of the gate electrode is flat even if the intergate insulating film IPD has an opening to make an hollow. A height of the upper surface of the selecting transistor ST1 or ST2 may be substantially equal to a height of an upper surface of the gate electrode of the memory cell transistor MT.

This recess structure 17 functions as a channel section of the selecting transistor and has a P-type layer in order to improve cutoff characteristics. Furthermore, an N⁺ layer 20 is formed in the semiconductor layer between the selecting transistors ST1 and ST2.

An interlayer insulating film 31 is provided to cover the upper side of the memory cell unit MU and the upper sides of the selecting transistors ST1 and ST2. The bit line contact BC and the source line contact SC are connected with the N⁺ layer 20 to reduce a contact resistance of the contacts and the semiconductor layer 13. The source line SL is provided on the source line contact SC to be electrically connected with the current path of the selecting transistor ST1.

The bit line BS is provided on the bit line contact BC to be electrically connected with the current path of the selecting transistor ST2. When the upper surfaces of the selecting transistors ST1 and ST2 are flat and the heights of the upper surfaces of the selecting transistors ST1 and ST2 are made equal to the height of the upper surface of each memory cell transistor MT, the bit line BL can be flatly formed, and a bit line open or the like is hardly produced. Further, an interlayer insulating film 32 is provided on the bit line BL.

Figure 5:
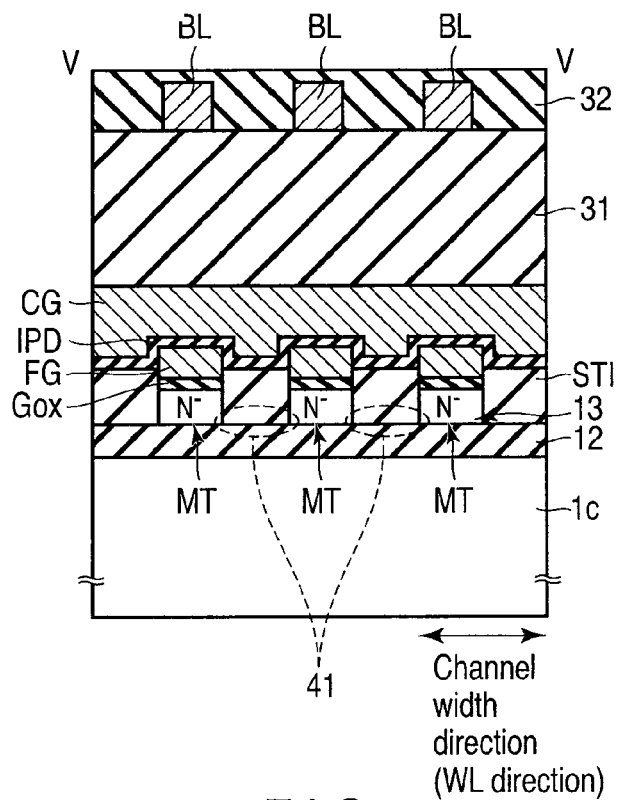
FIG. 5 is a cross-sectional view taken along a line V-V in FIG. 4.

As shown in FIG. 5, the floating gate FG is formed on the semiconductor layer 13 that is separated by the device isolation insulating film STI. The control electrode CG is formed on the floating gate FG through the inter-gate insulating film IPD. This control electrode CG is continuously formed on the plurality of floating gate FG to form the WL.

Moreover, as shown in each part surrounded by a broken line 41 in FIG. 5, the BOX layer 12 is in contact with the device isolation insulating film STI. Therefore, each semiconductor layer 13 formed below the floating gate FG is surrounded by the insulating film, thereby improving the breakdown voltage between the memory cell transistors MT. It is to be noted that each semiconductor layer 13 formed below the floating gate FG is likewise surrounded by the insulating film when the device isolation insulating film STI penetrates the BOX layer 12, and hence the same effect can be obtained.

An operation of the NAND flash memory according to the first embodiment will now be explained.

<Data Erasing Operation>

Data erasing means that electrons in the floating electrode FG in the memory cell transistor MT are discharged to provide a state where a threshold value is the lowest, and this erasing state is determined as data "1". As a result, binary storage is carried out, in which electrons are stored in the floating gate FG, and this high threshold value state is determined as data "0". Multi-valued storage can be performed by controlling a writing threshold value state to a plurality of threshold distributions, but an operation of binary storage will be explained hereinafter.

Figure 3:
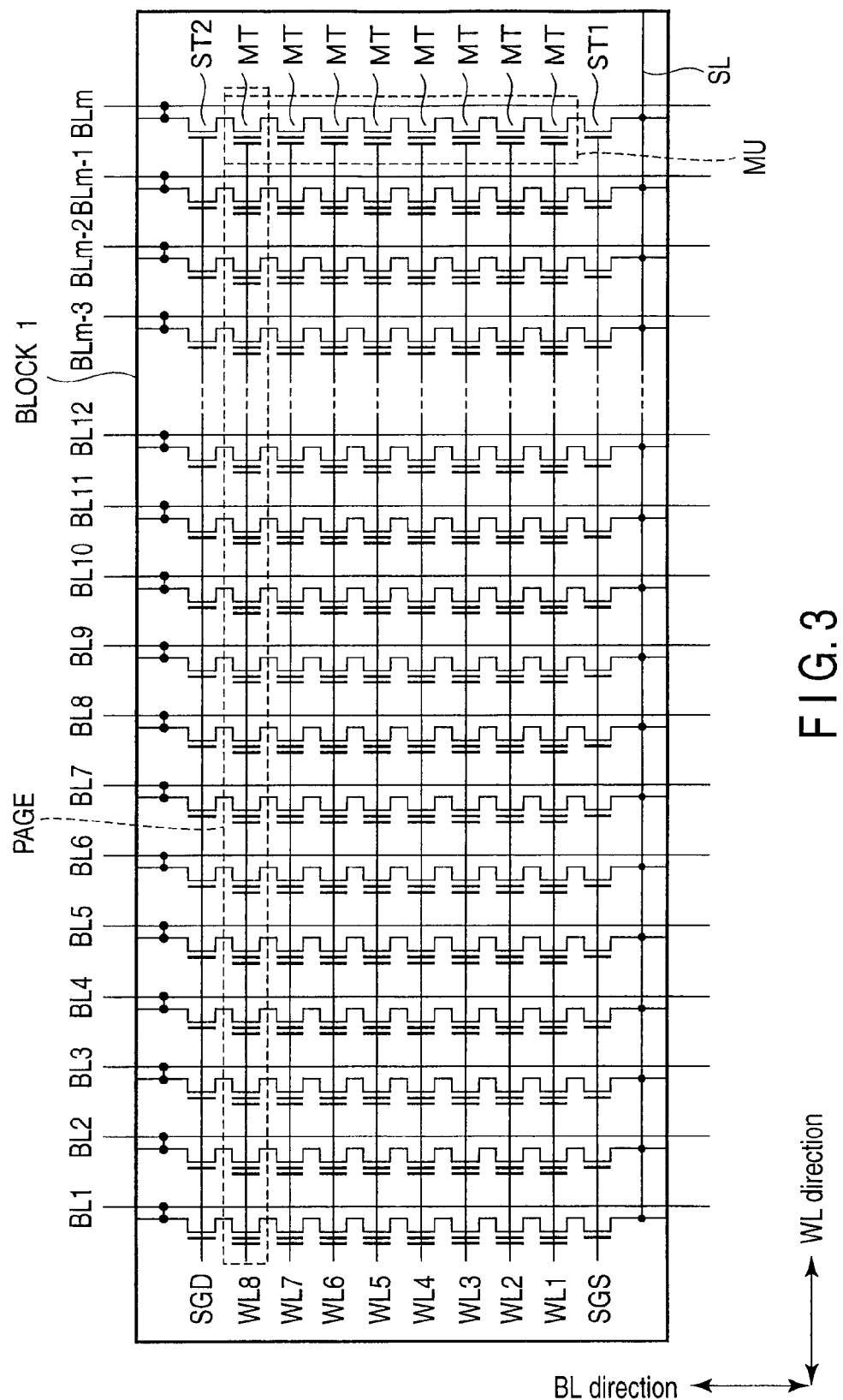
FIG. 3 is an equivalent circuit diagram of a BLOCK depicted in FIG. 2.

Data erasing is executed in the equivalent circuit depicted in FIG. 3 with the block BLOCK 1 being determined as an erasing unit.

The selecting gate lines SGD and SGS, the bit lines BL and the source line SL in the selected block are set in a floating state, all the word lines WL1 to WL8 in the selected block BLOCK 1 are set to 0V, and a positive erasing voltage Vera is supplied to the N well 1b and the P well 1c. The erasing voltage Vera is a voltage boosted to a value higher than a power supply voltage Vcc, e.g., approximately 15 to 25V by a regular booster.

Under such bias conditions, a PN junction between the n-type semiconductor layer 13 below the memory cell unit MU region and the p-type semiconductor layer 13 immediately below each selecting gate line is subjected to forward bias. Therefore, the n-type semiconductor layer 13 is charged to the erasing voltage Vera through the P well 1c to the p-type semiconductor layer 13 above the opening OP1 or OP2. As a result, a large electric field is applied to a part between the floating gate FG and the channel in each memory cell transistor MT in the selected block BLOCK 1, electrons in the floating gate FG are discharged by an FN tunneling current, and a threshold voltage comes to the lowest, so that the erasing state (the data "1" state) is established. The data erasing operation is carried out based on the above-explained operation.

<Data Writing>

Data writing is carried out in units of PAGE. An example where the word line WL1 is selected in the equivalent circuit depicted in FIG. 3 will be explained.

0V (or a small negative voltage) is supplied to the N well 1b and the P well 1c, a writing voltage Vpgm boosted to 15 to 20V is supplied to the selected word line WL1, a positive intermediate voltage lower than the writing voltage Vpgm is supplied to the remaining non-selected word lines, Vdd is supplied to the selecting gate line SGD on the bit line side, and 0V is supplied to the selecting gate line SGS on the source line side. 0V or an appropriate positive voltage is supplied to the source line SL.

Prior to application of the writing bias voltage, 0V (writing "0") or Vdd (writing "1") is supplied to the bit line BL in accordance with data to be written. As a result, 0V is supplied to the channel of the memory cell transistor for writing "0".

In the case of writing "1", the selecting transistor ST1 is turned off when its source (provided on an opposite side of the bit line) is charged to Vdd-Vth (Vth is a threshold value of the selected gate transistor), and the channel of the memory cell transistor enters a floating state.

When the writing voltage Vpgm and the intermediate voltage Vm are supplied in this state, electrons are injected into the floating electrode FG by the FN tunneling current in the selected cell for writing "0". That is, data "0" having a threshold value higher than that in the erase state is written. On the other hand, in the cell for writing "1", a potential of the floating channel is increased due to capacitive coupling, and injection of electrons does not occur. That is, the data "1" state is maintained. The data writing operation is carried out based on the above-explained operation.

<Data Reading>

A data reading operation is also executed in units of PAGE. An example where the word line WL1 is selected in the equivalent circuit depicted in FIG. 3 will be explained hereinafter.

The source line SL is set to 0V, and each bit line BL is previously charged to a predetermined positive voltage VBL and maintained in the floating state. The N well 1b is set to 0V (or a small negative voltage), a reading voltage Vr (e.g., 0V) is supplied to the selected word line WL1, a reading path voltage Vread that can turn on each cell without being dependent on cell data is supplied to the remaining non-selected word lines, and a voltage which can turn on the selecting gate transistor, for example, the reading pass voltage Vread is also supplied to the selecting gate lines SGD and SGS.

As a result, in the case of data "0", a selected cell is not turned on, and the bit line BL is not discharged. In the case of data "1", the selected cell is turned on, and the bit line BL is discharged. Therefore, data can be read by detecting a voltage in the bit line BL by a sense amplifier after a predetermined time of a bit line discharge operation. The data reading operation is carried out based on the above-explained operation.

As explained above, the selecting transistors ST1 and ST2 operate to cut off an operating voltage, e.g., the writing voltage that is transferred to the memory cell unit MU when, e.g., writing data in the memory cell transistor. However, the memory cell transistor MT is miniaturized as its generation advances, and its operating voltage at the time of erasing/writing/reading is not reduced even though an occupied area of the memory cell transistor is decreased.

Therefore, it is considered that the selecting transistors ST1 and ST2 that must cut off the operating voltage which is transferred to the memory cell unit MU do not involve miniaturization like that of the memory cell transistor, and miniaturization of the selecting transistors ST1 and ST2 is restricted in order to maintain cutoff characteristics.

However, each of the selecting transistors ST1 and ST2 according to this embodiment has the recess structure 17 in which only a substantially central part is lower than the upper surface of the semiconductor layer 13 having the memory cell unit MU provided thereon and which is placed above the opening OP1 or OP2.

Therefore, an effective channel length of each of the selecting transistors ST1 and ST2 can be increased, and the cutoff characteristics of each of the selecting transistors ST1 and ST2 can be improved. Further, since the channel length can be increased, a fluctuation in threshold voltage (Vth) can be prevented from being increased.

Furthermore, when a regular silicon-on-insulator (SOI) substrate is used to form the NAND flash memory, a special ingenuity must be exercised to supply an erasing voltage to the channel body of the memory cell unit. On the other hand, in this embodiment, the semiconductor layer (the N$^-$ well) 13 serving as the channel body is electrically in contact with the semiconductor substrate 11 through the openings OP1 and OP2 formed in the insulating film (BOX) layer 12. Therefore, the erasing voltage required for collective erasing can be supplied to the channel body (the N$^-$ well) of the memory cell unit MU, thereby assuredly performing erasing.

<Manufacturing Method for Semiconductor Device>

A manufacturing method for a semiconductor device according to the first embodiment will now be explained with reference to FIGS. 7 to 14. In this example, the semiconductor storage device depicted in FIG. 6 will be exemplified and explained. A description will be given in conjunction with a flowchart of FIG. 7.

First, as shown in FIG. 8, a P-type impurity such as boron (B) is implanted into the silicon substrate 11 by using, e.g., an ion implantation method to form the P well 1a. Subsequently, an N-type impurity such as arsenic (As) are implanted into the silicon substrate 11 by using, e.g., the ion implantation method to form the N well 1b on the P well 1a. Then, the P well 1c is formed on the N well 1b by using the same process.

Figure 7:
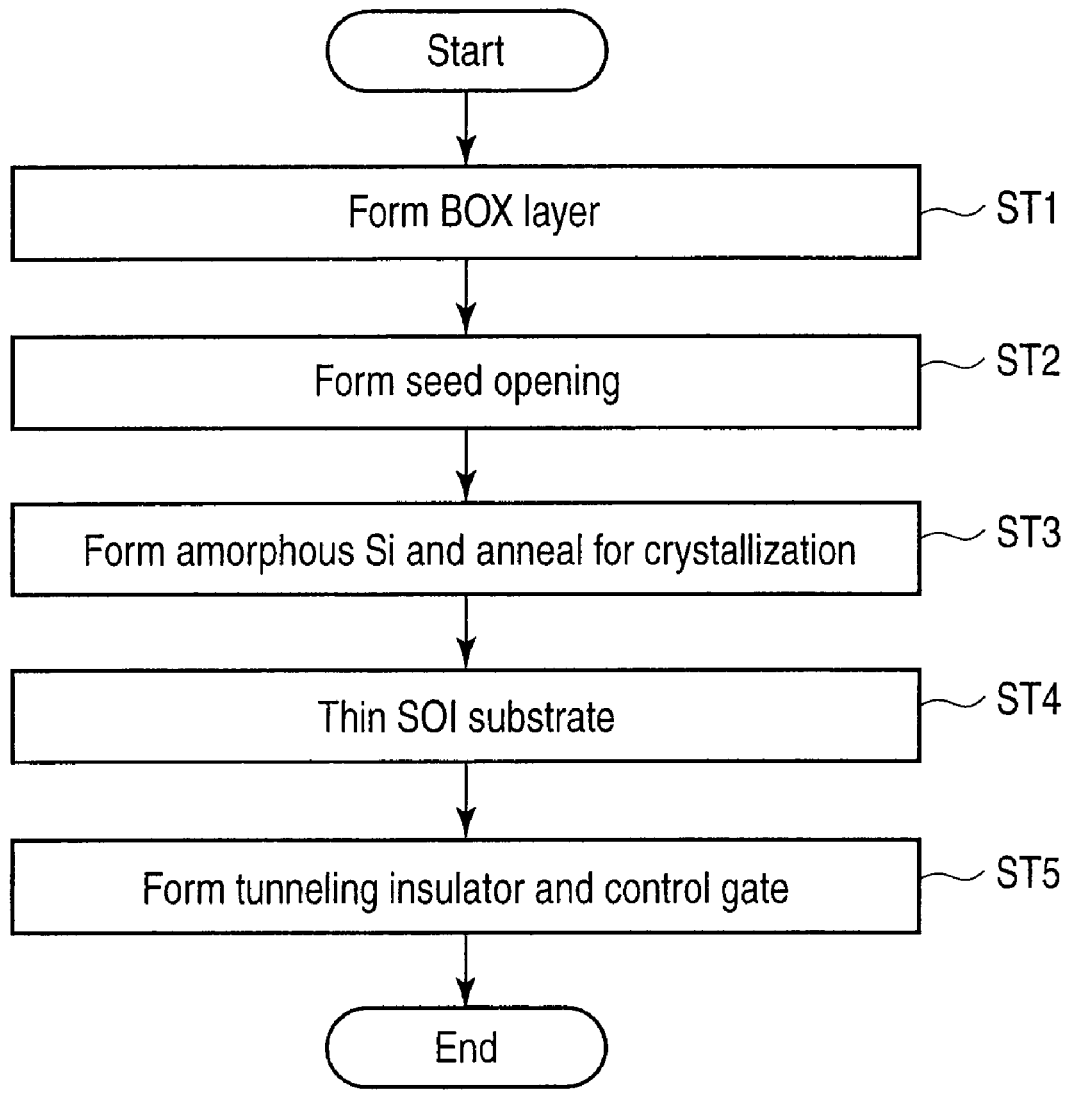
FIG. 7 is a flowchart for explaining a manufacturing method of the semiconductor storage device according to the first embodiment.

Subsequently, a silicon oxide (SiO$_2$) film or the like with a thickness of approximately 40 nm is formed on the semiconductor substrate 11 (the P well 1c) by, e.g., the chemical vapor deposition (CVD) method to form the BOX layer 12 (ST1 in FIG. 7).

Figure 9:
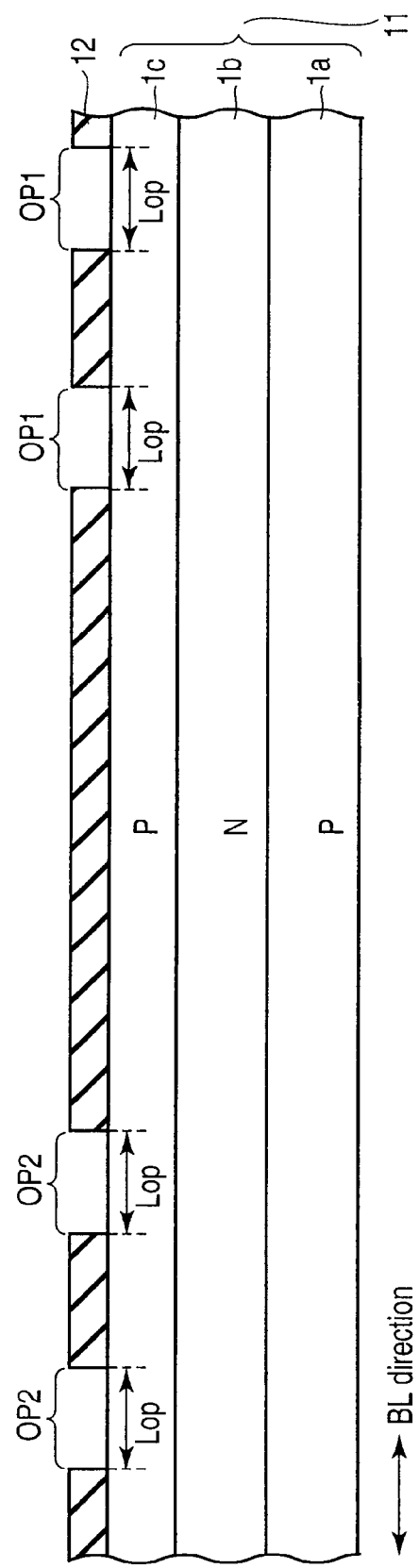

Then, as shown in FIG. 9, seed openings OP1 and OP2 from which a surface of the semiconductor substrate (the P well 1c) is exposed are formed by, e.g., the RIE method at positions where the selecting transistors ST1 and ST2 are formed. Here, as will be explained later, when an opening width Lop of each of the openings OP1 and OP2 in the bit line direction is selected as required, the recess structure 17 can be formed in an arbitrary shape. Furthermore, although a wet etching method can be also adopted at this time, a BOX layer shoulder at each opening portion is tapered (which will be explained later). A region sandwiched between the seed openings OP1 and OP2 (a region where the memory cell unit is formed) is, e.g., approximately 5 μm (ST2).

Figure 10:
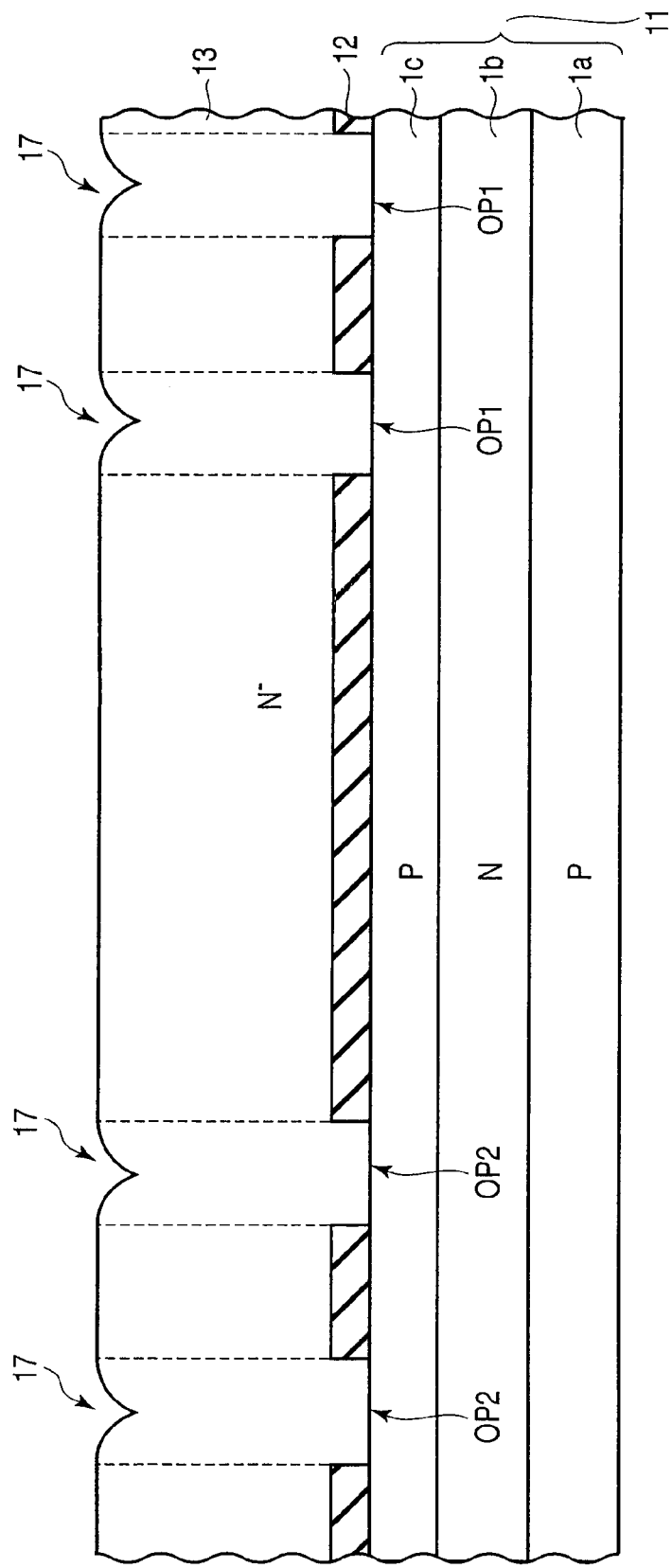

Then, as shown in FIG. 10, for example, the CVD method is used to form an amorphous silicon (a-Si) layer with a thickness of approximately 60 to 600 nm on the BOX layer 12. At this time, since the openings OP1 and OP2 are formed in the BOX layer 12, the recess structure 17 is formed above each of the openings OP1 and OP2 in a self-aligning manner (ST3).

Figure 11:
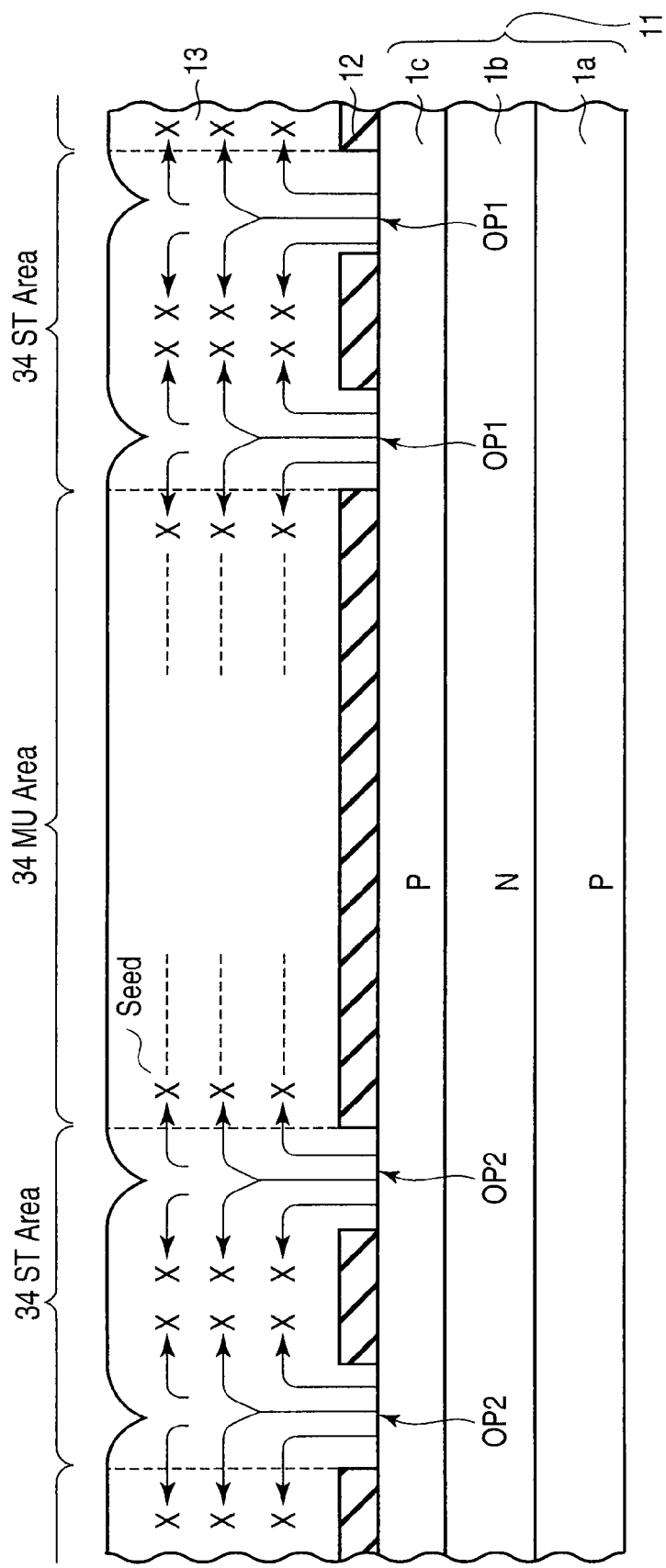

Subsequently, as shown in FIG. 11, the amorphous silicon layer is annealed at, e.g., approximately 500° C. At this time, each crystal of the substrate 11 exposed from each of the seed openings OP1 and OP2 is used as a crystal seed (a mark x in the drawing) to subject the amorphous silicon layer to solid-phase growth, thereby obtaining the crystalline silicon layer 13 having an excellent quality. Moreover, in this annealing process, it is possible to perform solid-phase growth of the amorphous silicon layer in not only an ST area 34 where the selecting transistor is formed but also an MU area 33 where the memory cell unit MU is formed (ST3).

Figure 12:
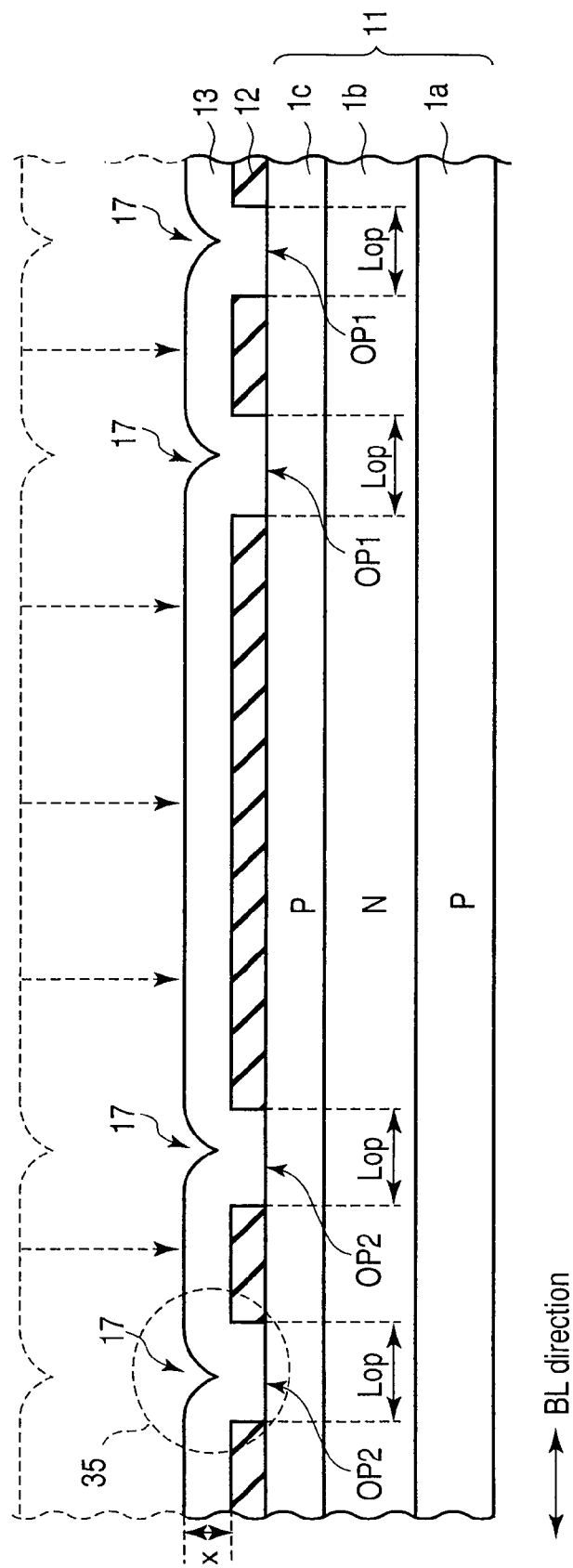

Then, as shown in FIG. 12, for example, anisotropic etching, e.g., the reactive ion etching (RIE) method is carried out with respect to the surface of the semiconductor (silicon) layer 13 to thin the semiconductor layer 13 (ST4). At this time, a film thickness x of the semiconductor layer 13 is, e.g., approximately 20 to 100 nm. Even after this process, the recess structure 17 formed by the preceding process can be formed keeping the shape as it is above each of the openings OP1 and OP2 in a self-aligning manner.

Estimation of a step in a part 35 near the opening OP2 in FIG. 12 will now be explained with reference to FIG. 13. As shown in the drawing, a step dimension Δ from a bottom surface of the recess structure 17 to the surface of the semiconductor layer 13 is represented by the following Expression (1) where da-Si is determined as a radius with a corner of the opening OP2 at the center.

$$\Delta = da\text{-}Si - x \quad (1)$$

Here, x is a film thickness of the semiconductor layer 13 and $x = (da\text{-}Si^2 - (Lop/2)^2)^{1/2}$ is achieved.

As represented by Expression (1), when the opening width Lop of the seed opening OP1 or OP2 is large, the step Δ of the recess structure 17 formed above the opening OP1 or OP2 is increased. When the step Δ is increased, device characteristics or subsequent processing steps may be possibly adversely affected, which is not desirable.

Therefore, it is desirable for the opening width Lop of the seed opening OP1 or OP2 to be small so that the step Δ can be ignored in relation to the device characteristics or the subsequent processing steps. More specifically, for example, it is desirable for the opening width Lop to be smaller than 200 nm. Converting the opening width into the step, it is 20 nm or below.

Figure 14:
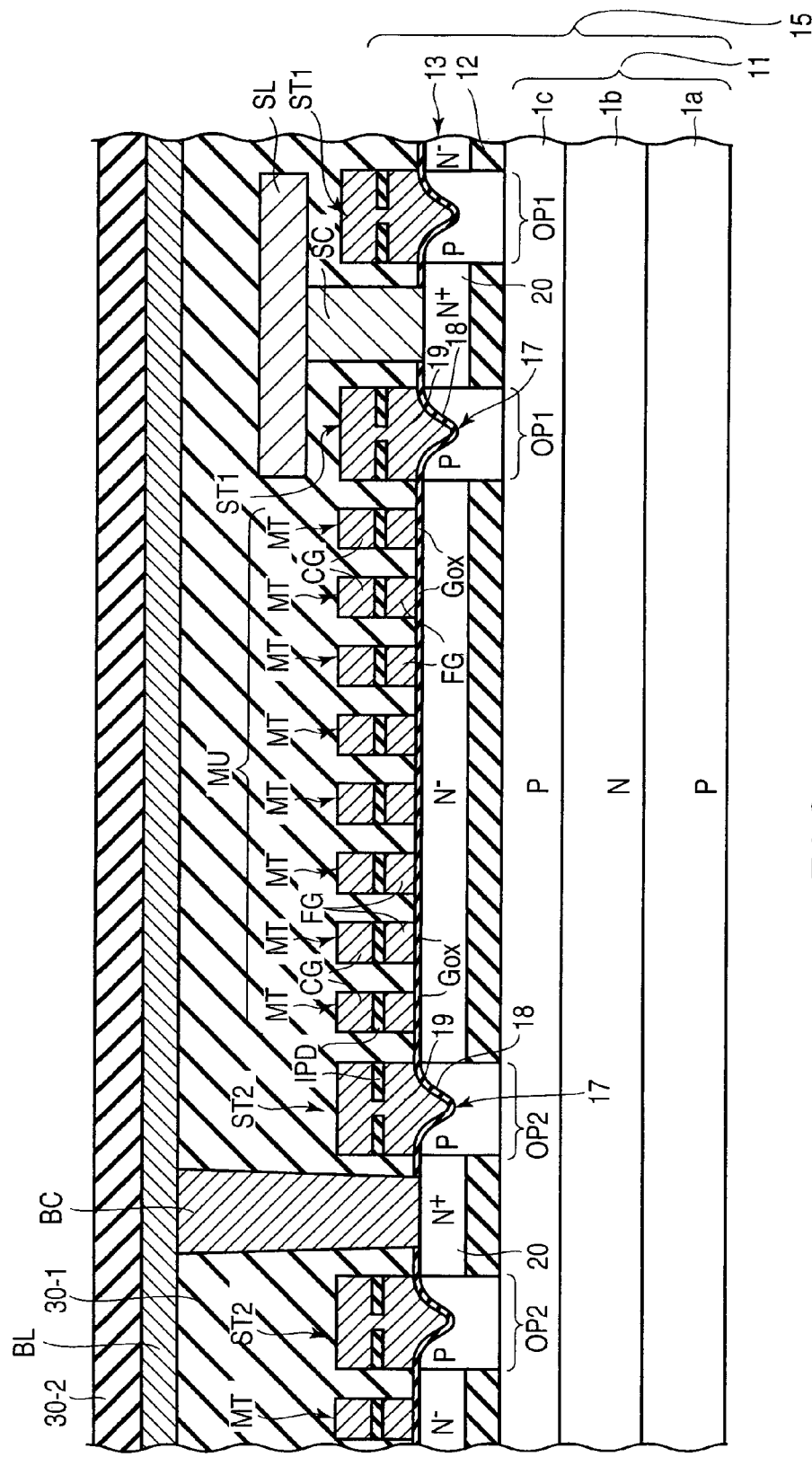
FIG. 14 is a cross-sectional view of a step following FIG. 12.

Subsequently, as shown in FIG. 14, an oxide film is formed by, e.g., a thermal oxidation method on the semiconductor layer 13 having the recess structure 17 formed therein to form the tunnel insulating film Gox and the gate insulating film 18. Then, a polysilicon layer is deposited on the tunnel insulating film Gox and the gate insulating film 18 by a known manufacturing process, and thereafter the device region is divided into a plurality of regions by forming the device isolation regions reaching the BOX layer 12.

Further, upper surfaces of the memory cell transistors and the selecting transistors may be flattened by using upper surfaces of these device isolation regions. For example, the upper surface of the poly silicon layer, which is a part of the gate electrode of the selecting transistors ST1 and ST2 formed on the recess structures, is flattened by over-etching through the use of CMP. In other words, the formation of the poly silicon layer on the recess structure 17 makes a recess on the surface of the poly silicon layer. The above over-etching can make the recess formed on the poly silicon layer flat. Further, the heights of the upper surfaces of the poly silicon layers of the selecting transistors ST1 and ST2 can be matched with the heights of the upper surfaces of the floating gates FG of the memory cell transistors MT. This makes the following processing easier.

Then, the inter-gate insulating film IPD, the polysilicon layer, and others are sequentially stacked and processed to form the memory cell transistors and others (ST5). Subsequently, a known manufacturing step is carried out to fabricate the semiconductor storage device depicted in FIG. 6.

Here, when the upper surface of the poly silicon layer is flattened, the upper surfaces of the gate electrodes of the selecting transistors ST1 and ST2 are made substantially flat. Further, the heights of the upper surfaces of the gate electrodes of the selecting transistors ST1 and ST2 can be matched with the heights of the upper surfaces of the control gates CG of the memory cell transistors MT.

According to the semiconductor storage device and the manufacturing method thereof concerning this embodiment, at least the following effects (a) to (c) can be obtained.

(a) When the memory cell unit and the selecting transistors are formed on the semiconductor layer configured on the SOI, characteristics of the selecting transistors can be improved.

As explained above, each of the selecting transistors ST1 and ST2 has the recess structure 17 in which only the substantially central part is lower than the upper surface of the semiconductor layer having the memory cell unit MU provided thereon and which is placed above the opening OP1 or OP2.

Therefore, the effective channel length of each of the selecting transistors ST1 and ST2 can be increased, thereby improving the cutoff characteristics of the selecting transistors ST1 and ST2. Additionally, since the channel length can be increased, a fluctuation in threshold voltage (Vth) can be prevented from being increased.

Further, since the memory cell unit MU is provided on the partial SOI substrate (the support substrate) 15, the breakdown voltage between the memory cells can be improved.

Since the effective channel length of each of the selecting transistors ST1 and ST2 can be increased in this manner, a gate length can be shrunk while maintaining the channel length. Therefore, it can be said that this embodiment is advantages in miniaturization since degradation in transistor characteristics of the selecting transistors ST1 and ST2 can be suppressed even if miniaturization based on shrinkage of the gate length proceeds.

(b) This embodiment is also advantages to a reduction in manufacturing cost.

In this embodiment, like the steps ST3 and ST4, the recess structure 17 can be formed above the opening OP1 or OP2 in the self-aligning manner. Therefore, this embodiment is advantageous to a reduction in manufacturing cost since an additional photolithograph step or the like for formation of the recess structure 17 is not required.

(c) The shape of the recess structure 17 can be controlled as required.

The shape of the recess structure 17 can be controlled as required by selecting manufacturing conditions, e.g., an opening shape of the opening OP1 or OP2 at the step ST2 or a film thickness of the BOX layer 12 at the step ST3.

For example, the shape of the recess structure 17 can be controlled by using the following parameters.

The film thickness of the BOX layer 12
The opening width Lop of the seed opening OP1 or OP2
A taper angle of the seed opening OP1 or OP2

An amount of boring the Si substrate when forming the seed opening OP1 or OP2
An amorphous-Si film thickness
A temperature and a pressure at which the amorphous-Si film is formed Operating the parameters enables selecting the shape of the recess structure 17, thereby controlling the channel length of the selecting transistor ST1 or ST2.

Figure 13:
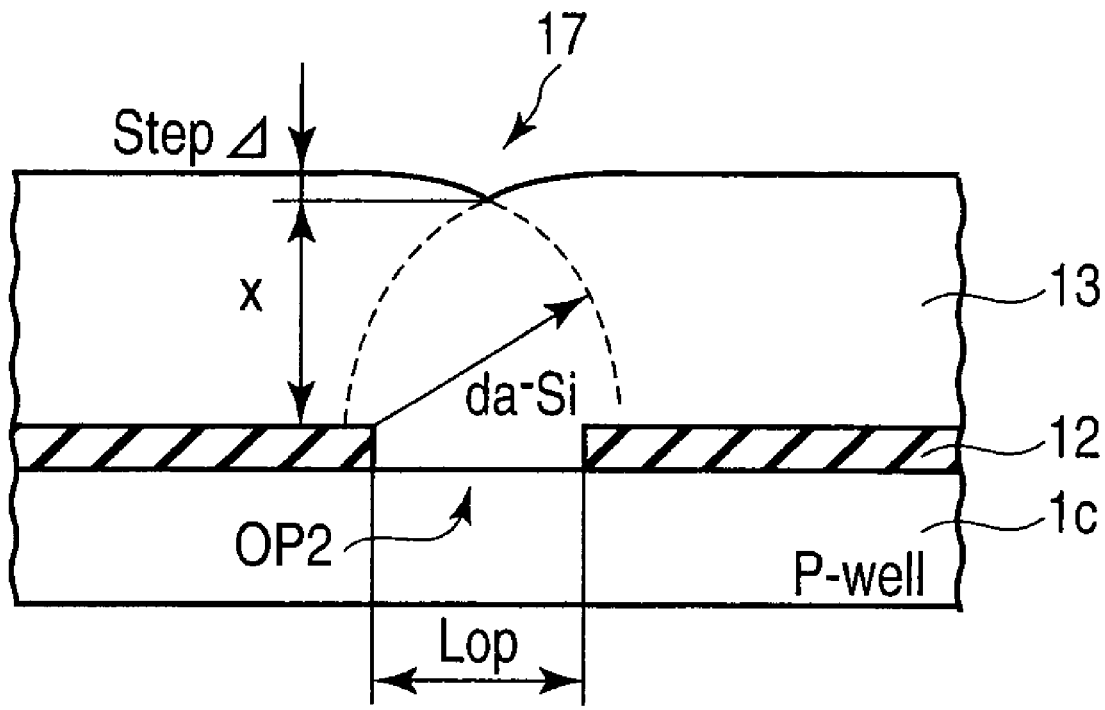
FIG. 13 is a schematic cross-sectional view for explaining estimation of a size of a step depicted in FIG. 12.

In this embodiment, as shown in FIG. 13, the control based on the opening width Lop of the seed opening OP1 or OP2 is taken as the example and explained. That is, the step dimension $\Delta$ from the bottom surface of the recess structure to the surface of the semiconductor layer 13 can be represented by Expression (1).

As represented by Expression (1), when the opening width Lop of the seed opening OP1 or OP2 is large, the step $\Delta$ of the recess structure 17 formed above the opening OP1 or OP2 is increased. When the step $\Delta$ is increased, the device characteristics or subsequent processing steps may be possibly adversely affected, which is not desirable.

Therefore, it is desirable for the opening width Lop of the seed opening OP1 or OP2 to be small so that the step $\Delta$ can be ignored in relation to the device characteristics or the subsequent processing steps. More specifically, for example, it is desirable for the opening width Lop to be smaller than 200 nm. More preferably, it is desirable for the opening width Lop to fall within the range of 10 to 50 nm.

This embodiment is advantageous in that the shape of the recess structure 17 can be controlled as required.

A method of controlling the shape of the recess structure 17 will now be more specifically explained hereinafter. However, the control method is not restricted thereto.

FIRST SPECIFIC EXAMPLE OF CONTROL OVER RECESS STRUCTURE SHAPE

In a first specific example, an example of controlling the shape of the recess structure based on a relationship between the step of the recess structure and the opening width will be explained.

Figure 15:
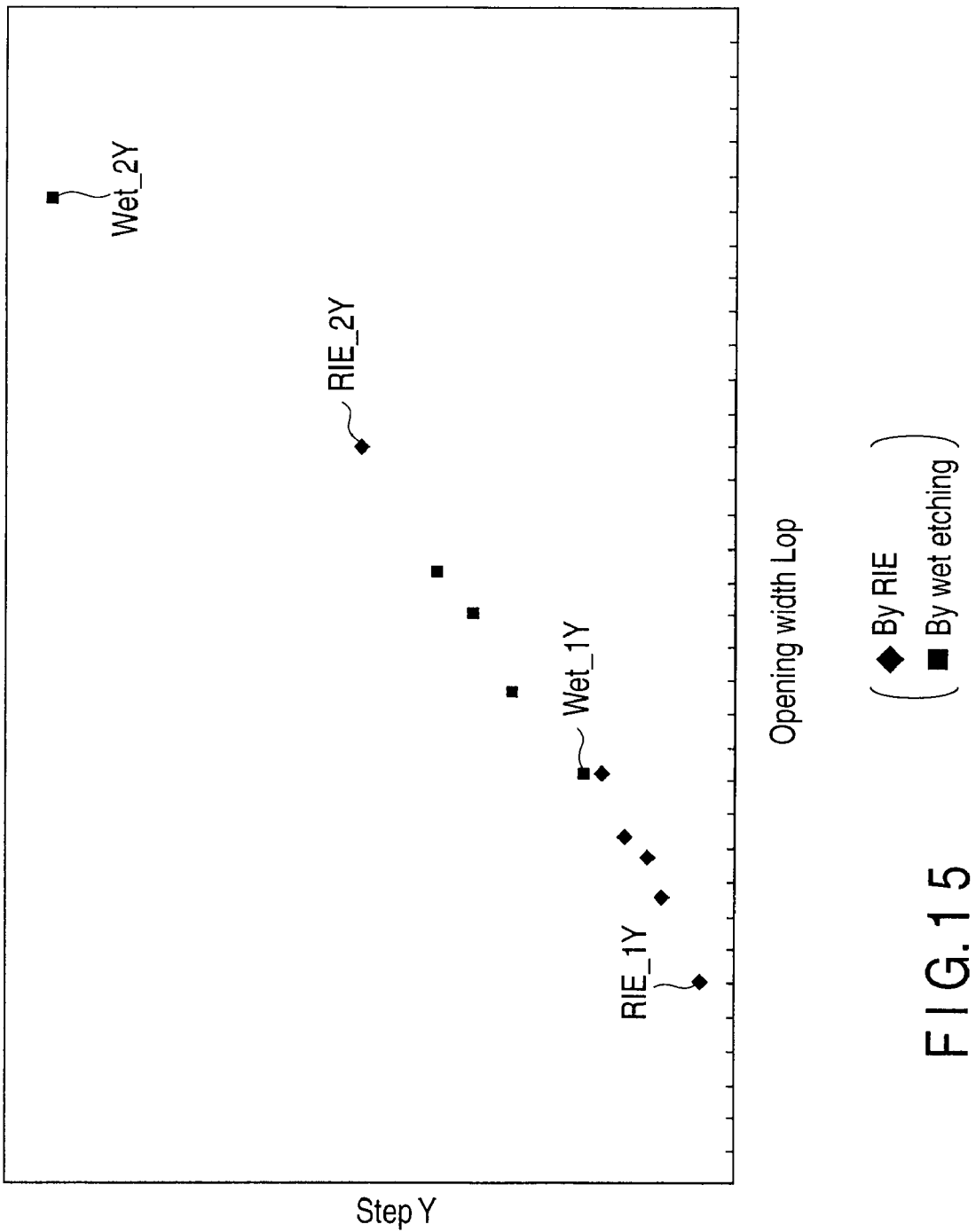
FIG. 15 is a view showing a relationship between a step and an opening width in a recess structure.

FIG. 15 is a view showing a relationship between a step Y of the recess structure 17 and the opening width Lop. The drawing shows an example using the RIE method and an example using the wet etching method when forming each of the openings OP1 and OP2 at the manufacturing step ST2. Here, the step Y of the recess structure 17 corresponds to a height from the bottom portion of the recess structure 17 to the surface of the same, i.e., the step $\Delta$ depicted in FIG. 13. It is to be noted that the film thickness da-Si of the semiconductor layer 13 is fixed.

Cross-sectional views each showing a part near the recess structure 17 based on the size of the opening width Lop and opening means at several observation points in FIG. 16 will now be explained.

Figure 16:
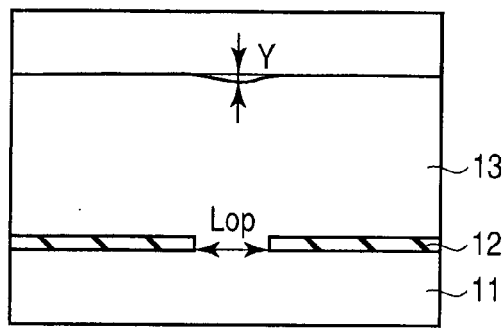
FIG. 16 is a view showing a cross-sectional structure at one observation point (RIE_1Y) in FIG. 15.

In the case of RIE_1Y (the opening width Lop=approximately 100 nm):

A cross-sectional structure in this case is as shown in, e.g., FIG. 16. As depicted in the drawing, the BOX layer 12 does not have a tapered portion. The step Y is approximately 10 nm.

Figure 17:
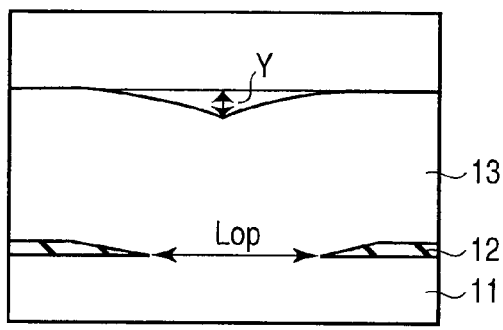
FIG. 17 is a view showing a cross-sectional structure at one observation point (Wet_1Y) in FIG. 15.

In the case of Wet_1Y (the opening width Lop=approximately 250 nm):

A cross-sectional structure in this case is as shown in, e.g., FIG. 17. As depicted in the drawing, the BOX layer 12 has a tapered portion.

Figure 18:
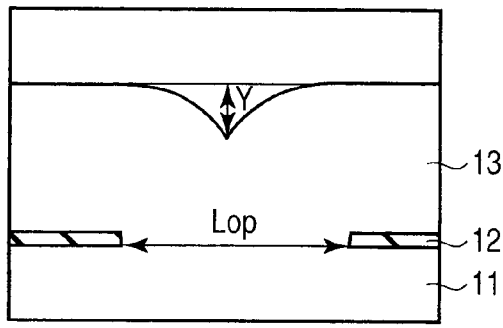
FIG. 18 is a view showing a cross-sectional structure at one observation point (RIE_2Y) in FIG. 15.

In the case of RIE_2Y (the opening width Lop=approximately 450 nm):

A cross-sectional structure in this case is as shown in, e.g., FIG. 18. As depicted in the drawing, the BOX layer 12 does not have a tapered portion.

In the case of Wet_2Y (the opening width Lop=approximately 600 nm):

A cross-sectional structure in this case is as shown in, e.g., FIG. 19. As depicted in the drawing, the BOX layer 12 has a tapered portion.

As shown in FIGS. 16 to 19, it can be understood that a tapered portion is not formed in the BOX layer 12 when the opening means is the RIE method and a tapered portion is formed in the BOX layer 12 when the opening means is the wet etching method. Further, as shown in FIG. 15, it can be understood that the recess structure 17 can be formed irrespective of which one of the RIE method or the wet etching method is adopted as the opening means and that the step Y is provided on the same characteristic line irrespective of which opening means is used. In this manner, it is revealed that the step Y is determined based on the dimension of the opening width Lop and is not dependent on presence/absence of the tapered portion of the BOX layer 12.

SECOND SPECIFIC EXAMPLE OF CONTROL OVER RECESS STRUCTURE SHAPE

In a second specific example, a method of controlling the shape of the recess structure based on a relationship between a recess shoulder width and an opening width will now be explained.

FIG. 20 is a view showing a relationship between a shoulder width Z of the recess structure 17 and the opening width Lop. The drawing shows an example using the RIE method and an example using the wet etching method when forming the openings OP1 and OP2 at the manufacturing step ST2. Here, a shoulder width Y of the recess structure 17 means a width of the recess structure 17 in a channel length direction of each selecting transistor, i.e., a distance from one position at which the upper surface of the semiconductor layer 13 starts to fall to the opposite position at which the opposite upper surface of the semiconductor layer 13 starts to fall. It is to be noted that the film thickness da-Si of the semiconductor layer 13 is fixed.

Cross-sectional views each showing a part near the recess structure 17 based on the size of the opening width Lop and the opening means at several observation points in FIG. 20 will now be explained.

In the case of RIE_1Z (the opening width Lop=approximately 100 nm):

A cross-sectional structure in this case is as shown in, e.g., FIG. 21. As shown in the drawing, the BOX layer 12 does not have a tapered portion.

In the case of RIE_2Z (the opening width Lop=approximately 250 nm):

A cross-sectional structure in this case is as shown in, e.g., FIG. 22. As shown in the drawing, the BOX layer 12 does not have a tapered portion. Moreover, the shoulder width Z is approximately 200 nm.

In the case of RIE_3Z (the opening width Lop=approximately 450 nm):

A cross-sectional structure in this case is as shown in, e.g., FIG. 23. As shown in the drawing, the BOX layer 12 does not have a tapered portion.

Figure 24:
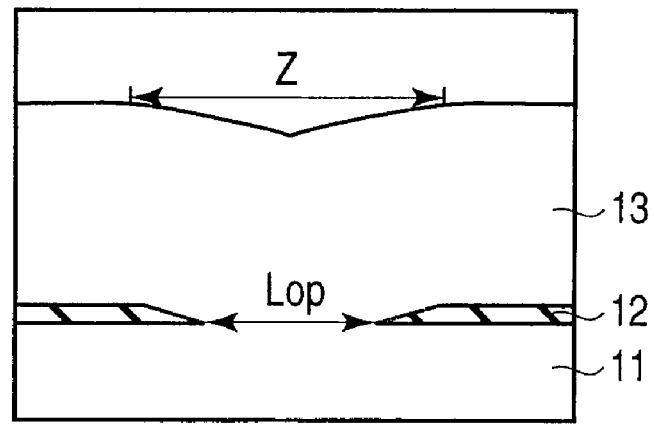
FIG. 24 is a view showing a cross-sectional structure at one observation point (Wet_1Z) in FIG. 20.

In the case of Wet_1Z (the opening width Lop=approximately 250 nm):

A cross-sectional structure in this case is as shown in, e.g., FIG. 24. As shown in the drawing, the BOX layer 12 has a tapered portion. It is to be noted that the opening width is the same as the opening width of RIE_2Z depicted in FIG. 23. Further, the shoulder width Z is approximately 450 nm.

Figure 25:
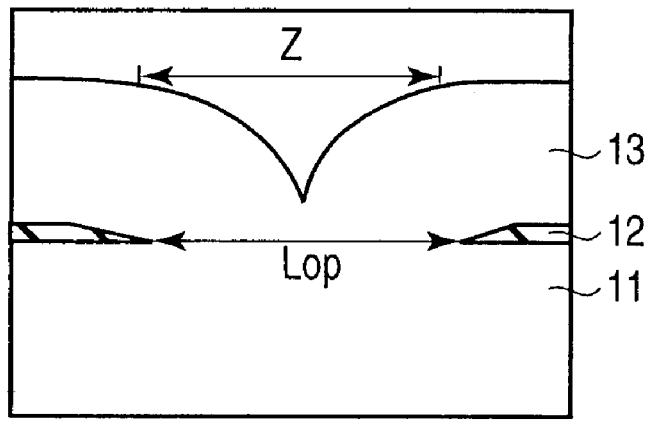
FIG. 25 is a view showing a cross-sectional structure at one observation point (Wet_2Z) in FIG. 20.

In the case of Wet_2Z (the opening width Lop=approximately 600 nm):

A cross-sectional structure in this case is as shown in, e.g., FIG. 25. As shown in the drawing, the BOX layer 12 has a tapered portion.

As can be understood from a comparison between FIGS. 22 and 24, if the opening width Lop is unchanged, forming a tapered portion in the BOX layer 12 increases the shoulder width Z. Furthermore, as shown in FIG. 15, if the opening width Lop remains the same, the step Y of the recess structure 17 is unchanged.

That is, if the opening width Lop and the film thickness da-Si of the semiconductor layer 13 remain the same, using the wet etching method enables providing a gentle angle at a part where the surface of the recess structure 17 reaches the deepest position, thereby alleviating a concentration of an electric field. Furthermore, since the shoulder width Z is increased, the trapezoidal recess structure 17 can be formed even if the opening Lop is narrow.

Second Embodiment

A semiconductor storage device and a manufacturing method thereof according to a second embodiment will now be explained with reference to FIG. 26. A recess structure 17 in this embodiment has a trapezoidal shape. In this description, a detailed explanation of parts equal to those in the first embodiment will be omitted.

Figure 26:
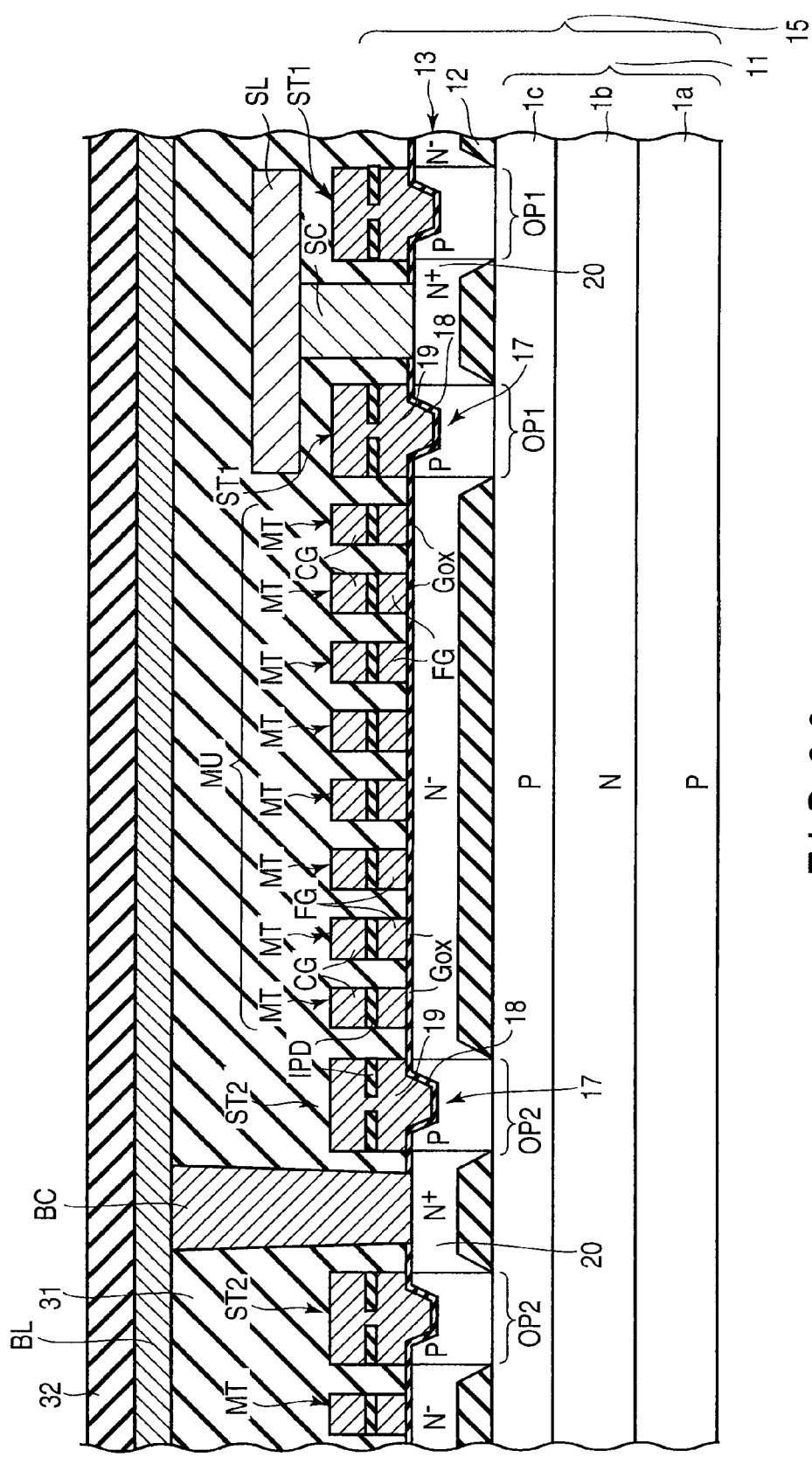
FIG. 26 is a cross-sectional view of a NAND flash memory according to a second embodiment.

As shown in FIG. 26, a semiconductor storage device according to this embodiment is different from the first embodiment in that each recess structure 17 has a trapezoidal shape and each corner portion of a BOX layer 12 has a sharp taper angle. Other manufacturing steps are the same as those in the first embodiment, and hence the flowchart of FIG. 7 is used.

To form the trapezoidal recess structure 17, the following manufacturing process can be used, for example. That is, at the manufacturing step ST2 (a step of forming openings OP1 and OP2) in FIG. 7, an opening width Lop is formed to be larger than that in the first embodiment by using wet etching. Since this wet etching is isotropic etching, an end portion of the BOX layer 12 is partially etched. Adjusting etching conditions enables forming a sharp taper angle at each corner portion of the BOX layer 12.

Subsequently, at the manufacturing step ST3, a film thickness of an amorphous silicon layer is formed to be thinner than that in the first embodiment. A film thickness of a semiconductor layer 13 is fixed at a position near the center of each recess structure 17, thereby forming each trapezoidal recess structure 17.

Then, executing the process at the manufacturing ST4 and subsequent steps like the first embodiment enables bringing the semiconductor storage device depicted in FIG. 26 to completion.

According to the semiconductor storage device and the manufacturing method thereof according to the second embodiment, at least the same effects as (a) to (c) explained in the first embodiment can be obtained. Moreover, the deepest part of the recess has a flat surface, thereby alleviating a concentration of an electric field in the recess portion.

As explained above, according to the embodiments of the present invention, when the memory cell unit and the selecting transistors are formed on the partial SOI, characteristics of the selecting transistors can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising: a semiconductor substrate;
    an insulating layer provided on the semiconductor substrate and having an opening;
    a semiconductor layer provided on the insulating layer, the semiconductor layer having a recess at a center of a surface thereof above the opening;
    a memory cell unit provided on the semiconductor layer and including a plurality of memory cells, current paths of the memory cells being connected in series;
    a selecting transistor adjacent to the memory cell unit and arranged on a region of the semiconductor layer including the recess, the selecting transistor including a gate insulating film provided on the region of the semiconductor layer including the recess and a gate electrode provided on the gate insulating film.

2. The device according to claim 1, wherein the semiconductor layer is a single-crystal layer.

3. The device according to claim 1, wherein the memory cell has a tunnel insulating film provided on the semiconductor layer, a charge storage layer provided on the tunnel insulating film, an inter-gate insulating film provided on the charge storage layer, and a control electrode provided on the inter-gate insulating film.

4. The device according to claim 1, wherein the semiconductor layer is a silicon layer of a first conductivity type, and each memory cell has the silicon layer serving as a channel body and a pair of source/drain and is configured as a transistor of the first conductivity type having a charge storage layer formed on the channel body and a control gate formed on the charge storage layer, and
    the selecting transistor has a channel body region formed in a diffusion layer of a second conductivity type and a channel of the first conductivity type is formed on the channel body region.

5. The device according to claim 1, wherein an upper surface of the gate electrode of the selecting transistor is flat.

6. The device according to claim 1, wherein a width of the opening is 200 nm or below.

7. The device according to claim 1, wherein a maximum value of a depth of the recess is 20 nm or below.

8. The device according to claim 1, wherein a central part of the recess is flat.

9. The device according to claim 1, wherein the opening of the insulating layer has a tapered portion where a diameter on the semiconductor layer side becomes larger than a diameter on the semiconductor substrate side.

10. The device according to claim 1, wherein a thickness of the semiconductor layer falls within a range of 20 to 100 nm.

* * * * *